(12) United States Patent
Hunter et al.

(10) Patent No.: US 10,608,456 B2
(45) Date of Patent: Mar. 31, 2020

(54) BATTERY SENSING VOLTAGE CONTROLLER

(71) Applicant: Texas Instruments Incorporated, Dallas, TX (US)

(72) Inventors: Bradford Lawrence Hunter, Spicewood, TX (US); Wan Laan Jackie Hui, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 162 days.

(21) Appl. No.: 15/840,882

(22) Filed: Dec. 13, 2017

(65) Prior Publication Data

US 2018/0254652 A1 Sep. 6, 2018

Related U.S. Application Data

(60) Provisional application No. 62/465,272, filed on Mar. 1, 2017.

(51) Int. Cl.
| | |
|---|---|
| *H02J 7/00* | (2006.01) |
| *G01R 31/367* | (2019.01) |
| *G01R 31/3835* | (2019.01) |

(52) U.S. Cl.
CPC .......... *H02J 7/0077* (2013.01); *G01R 31/367* (2019.01); *G01R 31/3835* (2019.01); *H02J 7/0029* (2013.01); *H02J 7/0031* (2013.01)

(58) Field of Classification Search
CPC .................................................... H02J 7/0026
USPC ................................................. 320/134, 136
See application file for complete search history.

(56) References Cited

U.S. PATENT DOCUMENTS

2016/0093921 A1* 3/2016 Kadirvel ............... H01M 10/48
320/112

* cited by examiner

*Primary Examiner* — Edward Tso
*Assistant Examiner* — Ahmed H Omar
(74) *Attorney, Agent, or Firm* — Tuenlap Chan; Charles A. Brill; Frank D. Cimino

(57) ABSTRACT

A battery pack includes a housing, a battery, a battery pack output voltage path that includes a charge power switch and a discharge power switch, and a battery sense output. A switch can be operably coupled between the battery and the battery sense output and configured to selectively open and close a battery sense path between the battery and the battery sense output. By one approach a first control circuit controls the open and close state of the aforementioned switch (in response, for example, to a comparison of the voltage differential across the switch to a predetermined threshold such that the switch is opened when the voltage differential across the switch becomes too positive or too negative with respect to battery voltage).

14 Claims, 4 Drawing Sheets

BATTERY SENSING VOLTAGE CONTROLLER

RELATED APPLICATION(S)

This application claims the benefit of U.S. Provisional application No. 62/465,272, filed Mar. 1, 2017, which is incorporated by reference in its entirety herein.

TECHNICAL FIELD

These teachings relate generally to battery charging and to corresponding protective capabilities.

BACKGROUND

Lithium ion battery packs are known in the art and find frequent use in such items as so-called smart phones, pad/tablet-based computers, laptop computers, and so forth. Users appreciate short charging time and rapid charging typically requires higher current flow (at present, sometimes as high as 10 A). Such battery packs often contain a standalone battery protector integrated circuit with power field effect transistors (FETs) to control bi-directional current flow.

Battery voltage must be sensed to ensure accurate charging but safety issues can arise in these regards. The voltage drop across the aforementioned FETs is relatively large with high charging currents. Providing a voltage sensing path around the power FETs poses risk in that such a path can provide a sneak current path for overcharging or over discharging the battery under various fault conditions.

BRIEF DESCRIPTION OF THE DRAWINGS

The above needs are at least partially met through provision of the switch-based control of a battery sense path described in the following detailed description, particularly when studied in conjunction with the drawings, wherein.

Figure 1:
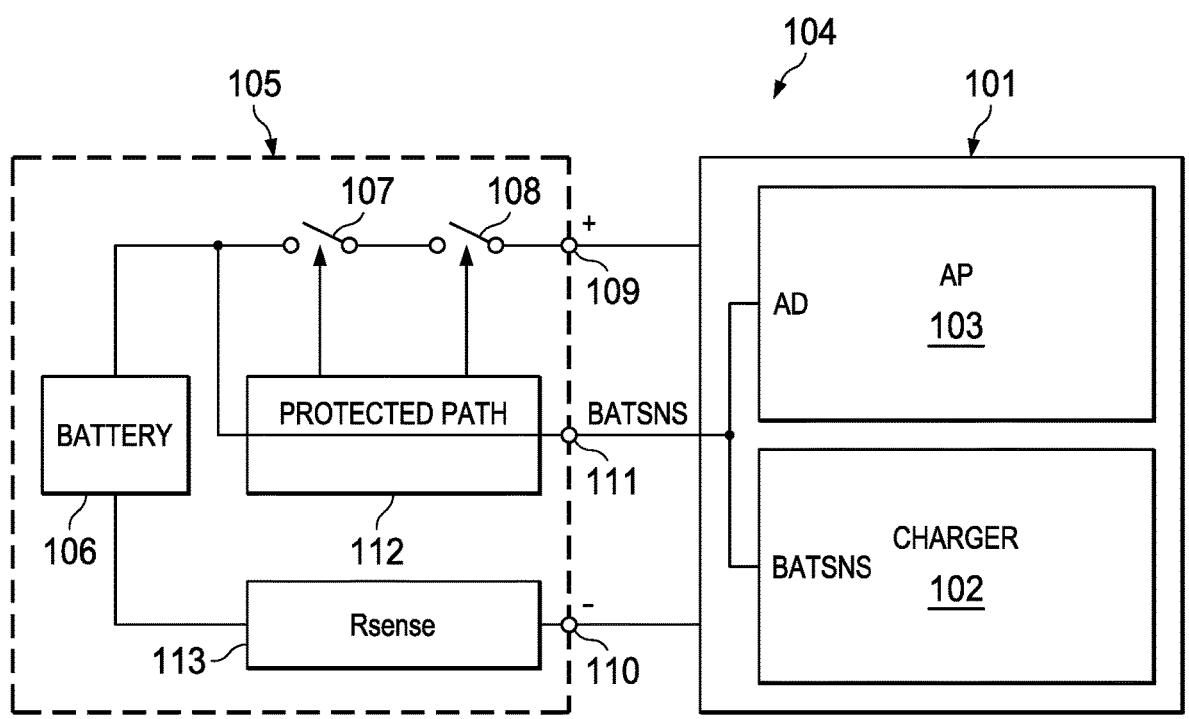
FIG. 1 comprises a block diagram as configured in accordance with various examples of these teachings.

Elements in the figures are illustrated for simplicity and clarity and have not necessarily been drawn to scale. For example, the dimensions and/or relative positioning of some of the elements in the figures may be exaggerated relative to other elements to help to improve understanding of various examples of the present teachings. Also, common but well-understood elements that are useful or necessary in a commercially feasible embodiment are often not depicted in order to facilitate a less obstructed view of these various examples of the present teachings. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

SUMMARY OF THE INVENTION

Generally speaking, pursuant to various examples described in this disclosure a battery pack includes a housing, a battery, a battery pack output voltage path that includes a charge power switch and a discharge power switch, and a battery sense output. A switch can be operably coupled between the battery and the battery sense output and configured to selectively open and close a battery sense path between the battery and the battery sense output. By one approach a first control circuit controls the open and close state of the aforementioned switch (in response, for example, to a comparison of the voltage differential across the switch to a predetermined threshold such that the switch is opened when the voltage differential across the switch becomes too positive or too negative with respect to battery voltage).

By one approach a second control circuit can serve to control the opened and closed state of the switch in response, at least in part, to control signals provided to the charge power switch and the discharge power switch. These teachings will also accommodate a variety of other modifications and supplemental features. For example, an AND gate can be provided having an output coupled to a control port for the aforementioned switch and having inputs that are respectively coupled to the aforementioned first and second control circuits. As another example, a selectively switchable current source can be disposed in parallel with the aforementioned switch (where, by one approach, the selectively switchable current source has an enablement state controlled by a fault recovery signal).

So configured, these teachings help to avoid risks represented by use of a battery sense path that can potentially allow current into and out of the battery in an uncontrolled fashion. In particular, these teachings provide for comparing the battery voltage to the battery sense voltage. In particular, this comparison serves to detect a voltage difference across the battery sense switch that indicates a fault condition. A high current through the battery sense switch will manifest as a high voltage and the aforementioned comparator will detect that high voltage and react by opening the switch. A negative voltage across the switch causes the switch to open and a recovery current to be activated. Removal of the negative voltage can be detected by the comparator and used to automatically close the switch.

These teachings can be implemented in a cost-effective manner and can yield consistent and reliable performance and results.

DETAILED DESCRIPTION

These and other benefits may become clearer upon making a thorough review and study of the following detailed description.

Referring now to the drawings, FIG. 1 presents a general view of an illustrative application setting in context with these teachings. This application setting includes a battery charging platform 101 that includes a charger component 102 and an analog processing component 103 (to facilitate, for example, battery charge gauging). This battery charging platform 101 operably couples to a battery pack 104 having a housing 105 that houses a number of components including a battery 106 (which may comprise, for example, one or more cells in series or parallel as desired or one or more stacks that each comprise, for example, a plurality of parallel-connected cells), a charge power switch 107, a discharge power switch 108, and three electrodes comprising a Pack+ electrode 109, a Pack− electrode 110, and a battery sense output 111 (denoted here as BATSNS) by which the battery pack 104 couples to the battery charging platform 101. In this illustrative example the Pack− electrode 110 couples to the battery 106 via a sense resistor 113 denoted as Rsense. This sense resistor 113 is used to measure a current by inferring the current from a measured voltage. The value of the sense resistance is known in the system and therefore from the voltage across the sensing resistor one can infer a current to create an inferred current threshold for comparison purposes.

The battery pack 104 also includes, in this embodiment, an integrated circuit 112 that outputs the aforementioned BATSNS signal. As will be described in more detail below, the BATSNS path constitutes a protected path that helps to preserve the safety and operational integrity of the foregoing components.

Figure 2:
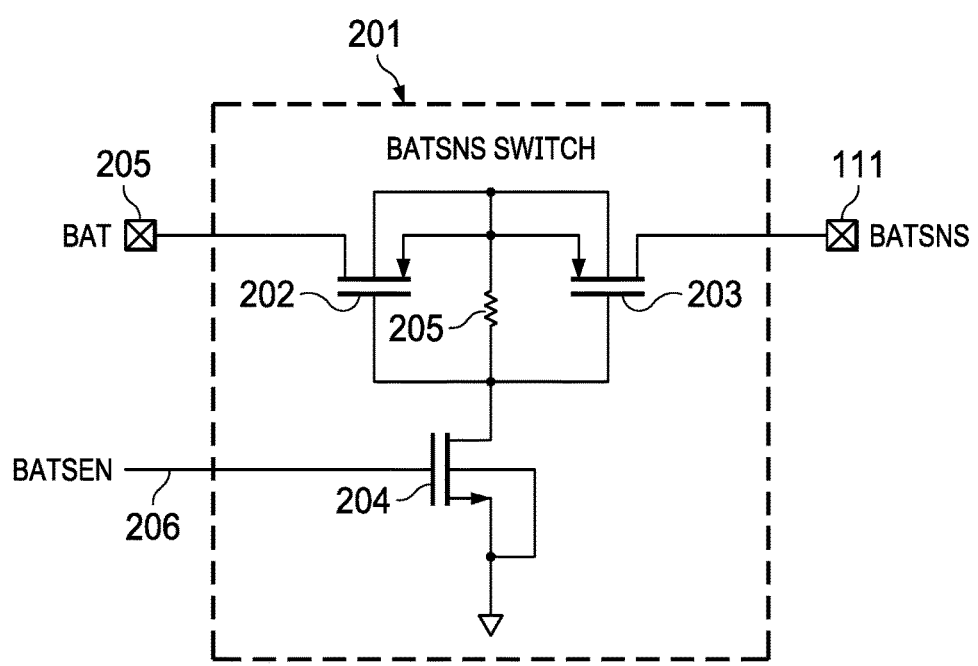
FIG. 2 comprises a schematic diagram as configured in accordance with various examples of these teachings.

With reference to FIG. 2, the aforementioned integrated circuit 112 includes a BATSNS switch 201. For the sake of an illustrative example this BATSNS switch 201 is shown here as comprising three transistors 202, 203, and 204 along with a resistor 205. It will be understood, however, that this particular circuit is intended to serve an illustrative purpose and is not intended to suggest any specific limitations in these regards. In this example two of the transistors 202 and 203 are coupled between the battery (represented here by a BAT electrode 205) and the aforementioned BATSNS output electrode 111. The remaining transistor 204 responds to a BATSEN signal 206 described below in more detail. The placement and operation of this BATSNS switch 201 appears below in more detail.

Figure 3:
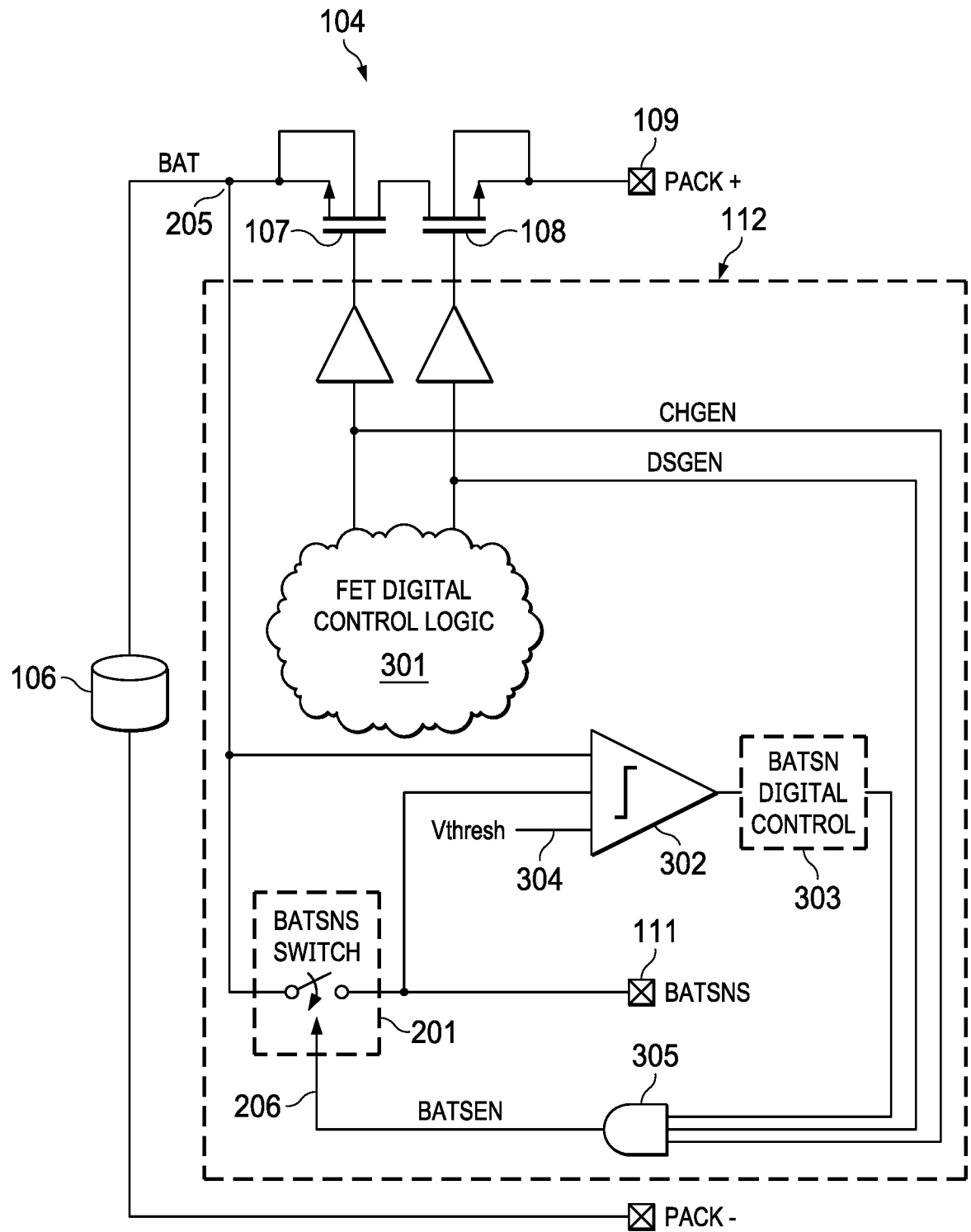
FIG. 3 comprises a schematic diagram as configured in accordance with various examples of these teachings.

FIG. 3 presents a more detailed system schematic for the aforementioned battery pack 104, including integrated circuit 112. In this illustrative circuit the BATSNS switch 201 serves as a pass gate that provides a path from the battery (BAT) to the output sense voltage (BATSNS) electrode 111.

This illustrative circuit depicts the aforementioned charge power switch 107 and discharge power switch 108 as comprising standard power FET's that respond to an FET digital control logic circuit 301 that serves to selectively activate the FET gate control voltages. Such components and logic are known in the art and can be employed here as desired and appropriate.

This illustrative circuit also includes a comparator 302 that monitors the differential voltage between BAT and BATSNS as compared to a dynamic threshold voltage 304 (Vthresh). This comparator 302 has its output coupled to a BATSNS digital control circuit 303 as a function of three inputs. One of these inputs couples to the aforementioned BAT electrode 205 while another of these inputs couples to the BATSNS side of the BATSNS switch 201. A remaining input receives a predetermined threshold 304 (i.e., the aforementioned dynamic threshold voltage Vthresh).

Also in this illustrative example this circuit includes a three input AND gate 305 that sources the aforementioned BATSEN signal 206 to control the aforementioned BATSNS switch 201. The inputs of this AND gate 305 couple respectively to the aforementioned BATSNS digital control circuit 303 and to the control inputs to each of the charge power switch 107 and discharge power switch 108, respectively.

So configured, this circuit effectively compares battery voltage to the battery sense voltage (i.e., the BATSNS signal). This comparison serves to detect a voltage difference across the battery sense switch 201 that can indicate a fault condition. Certain fault conditions can represent a state that will allow uncontrolled current into or out of the battery 106 and this circuit can serve to ameliorate or prevent the undue prolonging of such a state. In particular, a high current through the battery sense switch 201 will present itself as a high voltage and the comparator 302 will detect that voltage and react accordingly to effect the opening of the switch 201. Opening of the switch 201 will, of course, prevent the current flow of current.

Figure 4:
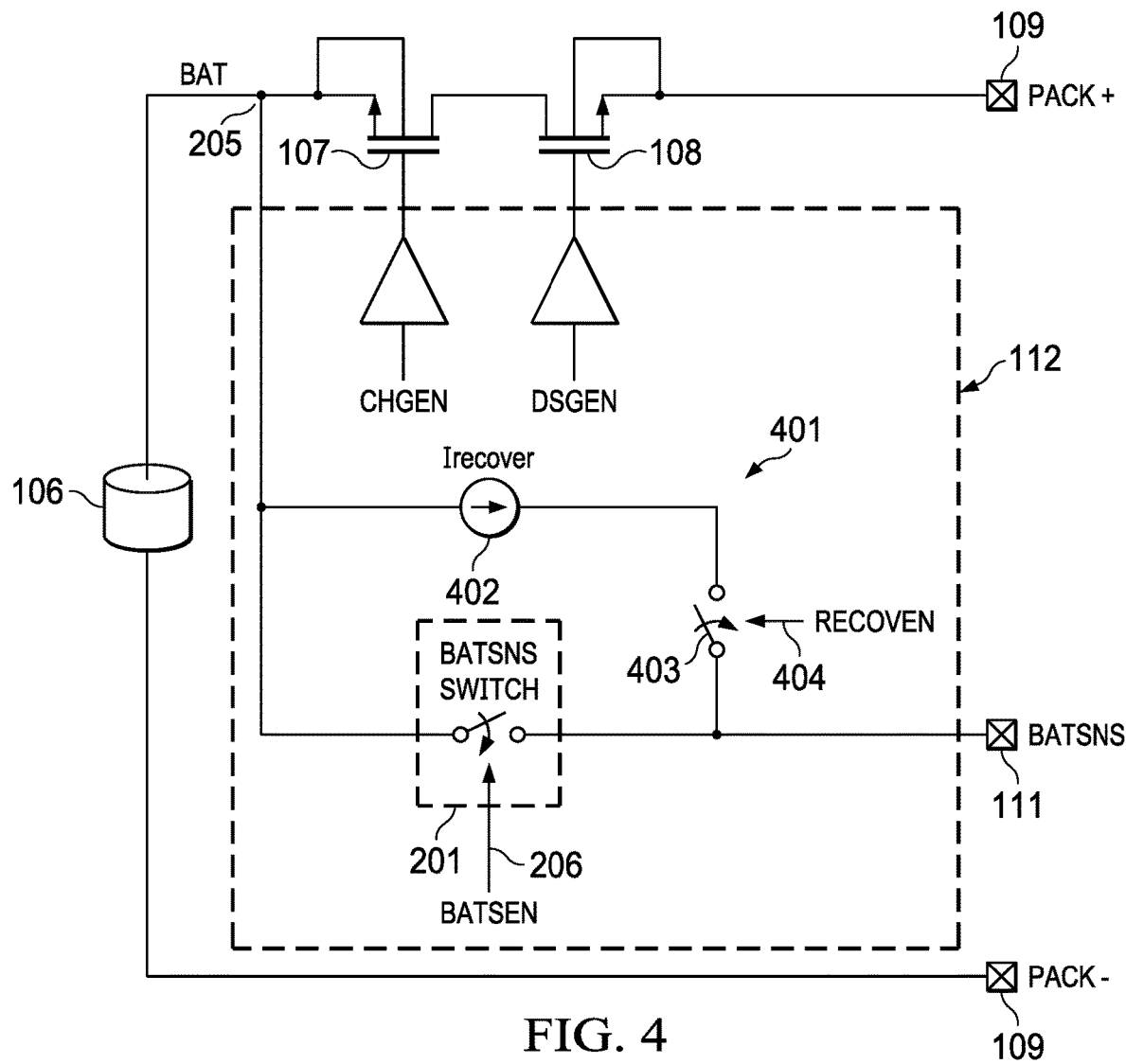
FIG. 4 comprises a schematic diagram as configured in accordance with various examples of these teachings.

A negative voltage across the switch 201 will similarly cause the switch to open and can also activate a recovery current if desired. FIG. 4 provides an illustrative example in these regards where the circuit is shown to additionally include a selectively switchable current source 401 that is disposed in parallel with the BATSNS switch 201. The selectively switchable current source 401 includes a pull-up current source 402 (denoted here as Irecover) in series with a switch 403 that responds to a RECOVEN signal 404 provided by the BATSNS digital control circuit 303 in FIG. 3.

So configured, the BATSNS digital control circuit 303 provides the RECOVEN signal 404 in response to a detected voltage short on the BATSNS line. The RECOVEN signal 404, in turn, activates the pull-up current provisioning.

Figure 5:
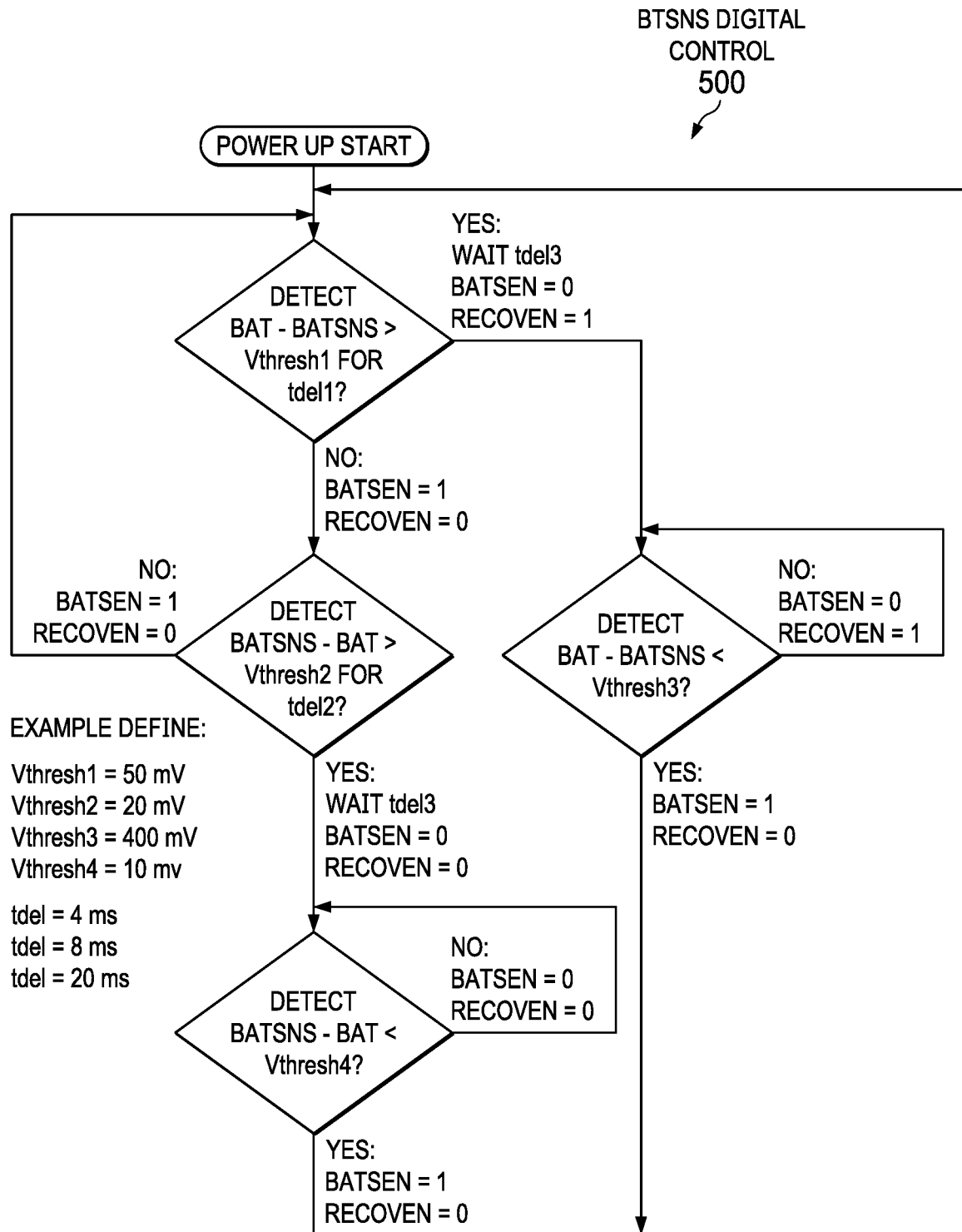
FIG. 5 comprises a control flow diagram as configured in accordance with various examples of these teachings.

FIG. 5 provides an illustrative control flow 500 that describes the behavior of the BATSNS digital control circuit 303. It will again be understood that the specifics of this example are intended to serve an illustrative purpose and are not intended to suggest any specific limitations in these regards.

Referring also to FIG. 3, in this illustrative example the comparator 302 can employ any or all of four different voltage thresholds Vthresh 304. In this example the four voltage thresholds are Vthresh1=50 mV, Vthresh2=20 mV, Vthresh3=400 mV, and Vthresh4=10 mV. A greater or lesser number of threshold values can be utilized and/or different threshold values can be utilized as desired to meet the needs and/or requirements of a particular application setting.

In this illustrative example the BATSNS digital control circuit 303 also utilizes three different time periods denoted here as tdel1 (which is 4 ms), tdel2 (which is 8 ms), and tdel3 (which is 20 ms). Again, a different number of time periods and/or time periods of different durations can be used as desired.

The BATSNS digital control circuit 303 utilizes the foregoing values as shown in the control flow 500 of FIG. 5. Generally speaking, there are two distinct fault states. In a first fault state BATSNS exceeds BAT by an overvoltage threshold. In a second fault state BATSNS is less than BAT by an under voltage threshold. The control flow 500 of FIG. 5 provides for testing for these fault states and also the relative persistence of such a state.

In response to detecting and confirming a particular fault state this control flow 500 then provides for one of two distinct fault recovery states. Upon detecting the overvoltage condition the BATSNS switch 201 is opened. The control flow 500 exits this state upon detecting that the BATSNS voltage drops to within a predetermined threshold voltage of BAT (for example, when the charger 101 is disengaged from the battery pack 104). The control flow 500 also opens the BATSNS voltage switch 201 upon detecting the undervoltage condition but then also activates the pull-up current capability to thereby facilitate recovering from a voltage short on BATSNS.

It may be noted that, in addition to the foregoing, a fault on either power FET 107 or 108 will also disable the BATSEN signal 206 and prompt corresponding opening of the BATSNS switch 201.

It will be appreciated that the described design is simple and readily configured using low-cost components and methodologies. In addition, the BATSNS switch 201 allows for accurate measurement of the battery voltage without introducing errors from a voltage buffer and does not require complex trim routines. Quite uniquely, these teachings simultaneously achieve low cost, safety, and accuracy.

Those skilled in the art will recognize that a wide variety of modifications, alterations, and combinations can be made with respect to the above described examples without departing from the scope of the invention, and that such modifications, alterations, and combinations are to be viewed as being within the ambit of the inventive concept.

What is claimed is:

1. An apparatus for use with a battery pack having a housing, a battery, a battery pack output voltage path that includes a charge power switch and a discharge power switch, and a battery sense output, the apparatus comprising:
    a battery sense path between the battery and the battery sense output;
    a switch operably coupled between the battery and the battery sense output and configured to selectively open and close the battery sense path;
    a first control circuit configured to generate a first control signal based on a comparison between a voltage across the switch and a predetermined threshold;
    a second control circuit configured to generate a second control signal based on a battery charge event or a battery discharge event; and
    an AND gate having a first input configured to receive the first control signal a second input configured to receive the second control signal and an output configured to operate the switch.

2. The apparatus of claim 1 further comprising:
    a selectively switchable current source disposed in parallel with the switch.

3. The apparatus of claim 2 wherein the selectively switchable current source has an enablement state controlled by a fault recovery signal.

4. A battery pack comprising:
    a housing;
    a battery disposed within the housing;
    a battery pack output voltage path that includes a charge power switch and a discharge power switch disposed within the housing;
    a battery sense output available external to the housing;
    a switch disposed within the housing and being operably coupled between the battery and the battery sense output and configured to selectively open and close a battery sense path between the battery and the battery sense output; and
    a selectively switchable current source disposed within the housing and disposed in parallel with the switch.

5. The battery pack of claim 4 and further comprising:
    a first control circuit disposed within the housing and configured to control the open and close state of the switch.

6. The battery pack of claim 5 wherein the first control circuit is configured to control the open and close state of the switch in response, at least in part, to a comparison of a voltage differential across the switch to a predetermined threshold.

7. The battery pack of claim 6 further comprising:
    a second control circuit disposed within the housing and also configured to control the open and close state of the switch in response, at least in part, to control signals provided to the charge power switch and the discharge power switch.

8. The battery pack of claim 7 further comprising:
    an AND gate disposed within the housing and having an output coupled to a control port for the switch and having inputs respectively coupled to the first and second control circuits.

9. The battery pack of claim 4 wherein the selectively switchable current source has an enablement state controlled by a fault recovery signal.

10. An apparatus for use with a battery pack having a housing, a battery, a battery pack output voltage path that includes a charge power switch and a discharge power switch, and a battery sense output, the apparatus comprising:
    a battery sense path between the battery and the battery sense output;
    switch means operably coupled between the battery and the battery sense output and configured to selectively open and close the battery sense path; and
    a selectively switchable current source disposed in parallel with the switch means.

11. The apparatus of claim 10 and further comprising:
    first control means configured to control the open and close state of the switch means such that the switch means is opened when a voltage differential across the switch means is outside of a predetermined range of battery voltage.

12. The apparatus of claim 11 further comprising:
    second control means also configured to control the open and close state of the switch means in response, at least in part, to control signals provided to the charge power switch and the discharge power switch.

13. The apparatus of claim 12 further comprising:
    an AND gate having an output coupled to a control port for the switch means and having inputs respectively coupled to the first and second control means.

14. The apparatus of claim 10 wherein the selectively switchable current source has an enablement state controlled by a fault recovery signal.

* * * * *